United States Patent [19]

Willer et al.

[11] Patent Number: 5,043,294

[45] Date of Patent: Aug. 27, 1991

[54] METHOD FOR MANUFACTURING AN FET WITH ASYMMETRICAL GATE REGION

[75] Inventors: Josef Willer, Riemerling; Guy Lefranc, Munich, both of Fed. Rep. of Germany

[73] Assignee: Siemens Aktiengesellschaft, Munich, Fed. Rep. of Germany

[21] Appl. No.: 574,106

[22] Filed: Aug. 29, 1990

[30] Foreign Application Priority Data

Sep. 4, 1989 [EP] European Pat. Off. ........... 89116311

[51] Int. Cl.$^5$ .................... H01L 21/28; H01L 21/338
[52] U.S. Cl. ........................................ 437/39; 437/41; 437/44; 437/45; 437/175; 437/196; 437/200; 437/919; 156/643; 148/DIG. 140
[58] Field of Search ....................... 437/27, 28, 29, 30, 437/40, 41, 44, 45, 175, 176, 178, 179, 184, 187, 245, 246, 912, 196, 200; 156/643; 148/DIG. 140; 357/23.3

[56] References Cited

U.S. PATENT DOCUMENTS

| | | | |
|---|---|---|---|
| 4,093,503 | 6/1978 | Harris et al. | 156/643 |
| 4,189,737 | 2/1980 | Schrader et al. | 357/23.3 |
| 4,354,896 | 10/1982 | Hunter et al. | 156/643 |
| 4,358,340 | 11/1982 | Fu | 156/643 |
| 4,419,809 | 12/1983 | Riseman et al. | 437/41 |
| 4,430,791 | 2/1984 | Dockerty | 357/23.3 |
| 4,432,132 | 2/1984 | Kinsbron et al. | 156/643 |
| 4,442,589 | 4/1984 | Doo et al. | 437/44 |
| 4,445,267 | 5/1984 | De La Moneda | 437/44 |
| 4,513,303 | 4/1985 | Abbas et al. | 357/23.3 |
| 4,532,698 | 8/1985 | Fang et al. | 437/40 |
| 4,587,709 | 5/1986 | Fowler et al. | 437/41 |
| 4,597,827 | 7/1986 | Nishitani et al. | 437/44 |
| 4,608,589 | 8/1986 | Goth | 357/23.3 |
| 4,630,085 | 12/1986 | Koyama | 357/23.3 |
| 4,645,563 | 2/1987 | Terada | 437/41 |
| 4,648,937 | 3/1987 | Ogura et al. | 437/233 |
| 4,649,638 | 3/1987 | Fang et al. | 437/233 |
| 4,689,869 | 9/1987 | Jambotkar et al. | 437/44 |
| 4,714,519 | 12/1987 | Pfiester | 437/44 |
| 4,727,038 | 2/1988 | Watabe et al. | 437/29 |
| 4,729,966 | 3/1988 | Koshino et al. | |
| 4,753,899 | 6/1988 | Colquhoun | 437/44 |
| 4,948,459 | 8/1990 | Van Laarhoven et al. | 156/643 |
| 4,992,387 | 2/1991 | Tamura | 437/44 |

FOREIGN PATENT DOCUMENTS

0133059 7/1984 European Pat. Off.
0177129 4/1986 European Pat. Off.

OTHER PUBLICATIONS

"Submicron-Gate Self-Aligned Gallium Arsenide FET Fabrication", IBM Technical Disclosure Bulletin, vol. 28, No. 6, Nov. 1985, pp.2687-2690.
"High Performance GaAs FET Device Structure", IBM Technical Disclosure Bulletin, vol. 31, No. 5, Oct. 1988, pp. 200-203.
Johnson et al., "Method for Making Submicron Dimensions in Structures Using Sidewall Image Transfer Techniques", IBM Technical Disclosure Bulletin, vol. 26, No. 9, Feb. 1984, pp. 4587-4589.
Geissberger et al., A New Refractory Self-Aligned Gate Technology for GaAs Microwave Power FET's and MMIC's, IEEE Transactions on Electron Devices, vol. 35, No. 5, May 1988, pp. 615-622.
Enoki et al., 0.3-$\mu$m Advanced SAINT FET's Having Asymmetric n$^+$-Layers for Ultra-High-Frequency GaAs MMIC's, IEEE Transactions on Electron Devices, vol. ED-35, No. 1, Jan. 1988, pp. 18-24.
Kimura et al., Asymmetric Implantation Self-Alignment Technique for GaAs MESFET's, Japanese Journal of Applied Physics, vol. 27, No. 7, Jul. 1988, pp. L1340-L1343.

Primary Examiner—Olik Chaudhuri
Assistant Examiner—M. Wilczewski
Attorney, Agent, or Firm—Hill, Van Santen, Steadman & Simpson

[57] ABSTRACT

A method for manufacturing a field effect transistor having source and drain regions asymmetrically arranged relative to the gate region. A strip-shaped auxiliary layer is applied in the region of the gate. A first and second spacer are laterally fashioned along an auxillary layer, the first spacer is covered with a resist mask and the second spacer is subsequently etched away. The source metallization and the drain metallization are then applied, and a planarizing passivation layer is applied therebetween. This is followed by the application of connecting metallizations for the source, drain and gate regions.

12 Claims, 4 Drawing Sheets

METHOD FOR MANUFACTURING AN FET WITH ASYMMETRICAL GATE REGION

BACKGROUND OF THE INVENTION

The present invention relates to field effect transistors (FET's) on semiconductor substrates, such as GaAs-MESFET or HEMT.

In attempting to optimize symmetrically constructed FET's, two conflicting requirements, which are in part mutually exclusive, must be resolved. One requirement is that an optimally low source resistance be provided. The other requirement is the need for a moderate drain implantation, referred to as a lightly doped drain (LDD). A compromise must be struck between these two conflicting requirements, as the former yields an optimally high transconductance and low noise, whereas the latter yields an optimally high breakdown voltage and high power. The conflict between these two requirements can only be avoided by asymmetrically designing the source region, or the drain region, with respect to the gate.

An additional requirement to be considered is the gate length; short gate lengths are necessary for optimum high-frequency performance. However, a short gate length usually produces a pronounced short-channel effect. Such an effect may be largely suppressed by an LDD region. However, the use of an LDD region to suppress the short-channel effect makes it difficult to simultaneously reduce the source resistance.

An FET having asymmetrical source of drain regions is described in T. Enoki, et al., "0.3-μm Advanced SAINT FET's Having Asymmetric n+-Layers for Ultra-High-Frequency GaAs MMIC's", IEEE Transactions on Electron Devices, Vol. 35, 18–24 (1988). The FET is manufactured by applying a resist mask having a T-shaped cross section to the gate region. The source and drain regions are manufactured by an oblique ion implantation. Portions of the surface not covered by the resist mask are covered with a layer of $SiO_2$. The resist mask is then removed, and a self-aligning gate metallization is applied, the $SiO_2$ layer serving as a masking layer.

An FET having asymmetrically doped source and drain regions is described in T. Kimura et al., "Asymmetric Implantation Self-alignment Technique for GaAs MESFETs", Japanese Journal of Applied Physics. Vol. 27, L1340–L1343 (1988). The FET is manufactured by first applying a high-temperature-resistant metal as a gate metallization. A germanium layer is subsequently applied surfaced-wide followed by a layer of resist. The source region is formed through an opening in the resist by etching a portion of the exposed germanium layer down to the gate of the metal. After erosion of the resist, a germanium layer having an opening in the source region remains. An ion implantation into the source region is achieved through this opening. After removing the germanium layer, a further ion implantation can be symmetrically applied to the source region and the drain region, followed by an annealing of the doping. The doping of the source region twice, results in an asymmetry between the source region and the drain region.

Another field effect transistor having asymmetrically designed source and drain regions, whose manufacture relies upon the use of a high-temperature-resistant metal for the gate metallization, is described in A. E. Geissberger, "A New Refractory Self-Aligned Gate Technology for GaAs Microwave Power FET's and MMIC's", IEEE Transactions on Electron Devices, Vol. 35, 615–622 (1988). A metallized gate layer is applied, followed by a strip of resist applied to one side, thereby allowing for an asymmetric doping of the metal. The gate metal is then asymmetrically disposed with respect to the source and drain regions.

SUMMARY OF THE INVENTION

The present invention provides a manufacturing method for an FET having a self-aligned, asymmetrically arranged gate, which can be readily performed, and with which extremely short gate lengths can be achieved.

To this end, the present invention provides a method that includes initially forming two side wall spacers at an auxiliary layer, one of which later serves as the gate electrode. The source and drain regions are symmetrically disposed relative to the auxiliary layer. The two spacers are formed by depositing a high-temperature-resistant metal across the surface, removing the high-temperature-resistant metal away from the source and the drain region by an etching process, thus leaving two spacers disposed adjacent to the auxiliary layer side walls. Subsequently, one of the spacers is removed by an etching process. The remaining spacer serves as a gate electrode, and is arranged asymmetrically with respect to the source and drain regions.

In a preferred embodiment, initial doping of the source and the drain regions is performed subsequent to the fabrication of the two spacers. Removing one of the spacers by etching is achieved by covering one spacer with resist mask, while etching the other spacer. Following the step of fabricating the gate metallization, a source metallization is applied to the source region, and a drain metallization is applied to the drain region. This method may be achieved in the embodiments described herein below.

In an embodiment, a first passivation layer of a dielectric is applied to the interspace between the source metallization and the first spacer, and a second passivation layer of a dielectric is applied to the interspace between the drain metallization and the first spacer, where the first spacer forms a gate metallization.

In a further embodiment, the step of depositing a dielectric layer across the surface of the substrate includes depositing a resist layer having a planar surface to the dielectric layer, etching a portion of the source metallization, the gate metallization and the drain metallization, such that the etched portions are exposed, the dielectric layer remaining between the source metallization, the gate metallization, and the drain metallization, and forming a passivation layer, such that an essentially planar surface is formed by a free surface of the source metallization, the gate metallization, the drain metallization, and the passivation layer in combination.

In an embodiment, a dielectric layer is deposited across the surface of the substrate. Holes are etched in the dielectric layer for source and drain regions. The surface of the gate metallization is at least partially exposed, and the source metallization and drain metallization are further deposited via the holes.

In an embodiment, a temperature step is performed for annealing the doping prior to removing the second spacer by etching.

In an embodiment, a temperature step is performed for annealing the doping subsequent to removing the second spacer by etching.

In a further embodiment, the temperature step consists of heating the metal at 800° C. for twenty minutes.

In an embodiment, a LDD-implantation (lightly doped drain) is deposited into the drain region following the removal of the second spacer, and prior to executing the temperature step.

In an embodiment, the auxiliary layer is removed following the doping of the source and drain regions.

In an embodiment, the auxiliary layer consists of a dielectric, which remains as a passivation layer.

In an embodiment, an additional metal strip is applied onto the auxiliary layer, where the metal strip proceeds with conforming edges relative to the auxiliary layer. The metal of the metal layer is chosen such that the high-temperatures-resistant metal can be selectively etched with respect to the metal strip, and the metal strip is arranged such that at least the first spacer is an electrical contact with the metal strip.

DETAILED DESCRIPTION OF THE PRESENTLY PREFERRED EMBODIMENTS

The present invention provides an improved method for manufacturing an FET having a self-aligned, asymmetrically arranged gate, with extremely short gate lengths.

Figure 1:
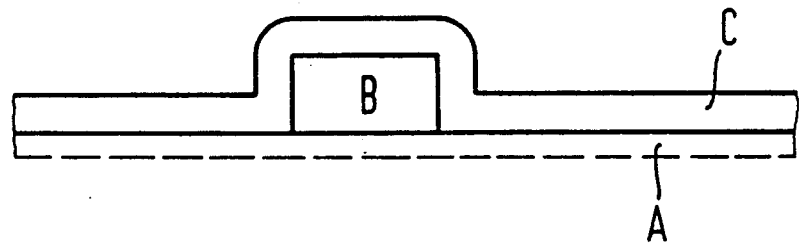
FIG. 1 illustrates a cross-sectional view of a first embodiment of a semiconducting substrate having an auxiliary layer and a surface-wide high-temperature-resistant metal layer in accordance with the principles of the present invention.

Referring now to the Figures, and specifically FIG. 1, pursuant to the method of the present invention, a symmetrically disposed auxiliary layer B, that extends in a strip-shape along the gate region, is placed at the surface of a conductive layer A of a semiconductor substrate as shown in FIG. 1. The auxiliary layer B can be aluminum, and the strip-shaped structure can be achieved using a lift-off technique. The substrate can be selectively doped by ion implantation. A metal layer C of high-temperature-resistant gate metal, for example $WSI_{0.4}$, is deposited across the surface using a largely conforming deposition process. The metal layer C is anisotropically re-etched to a first spacer and further reetched to a second spacer E. Subsequently, an ion implantation of the source region A' and the drain region A'' is applied, wherein the ion implantation is self-aligned with respect to the auxiliary layer B and the first and second spacers D and E. Further doping can be selectively limited with respect to structures on the surface of the conductive layer A, by suitably applying adjusted resist masks.

Figure 2:
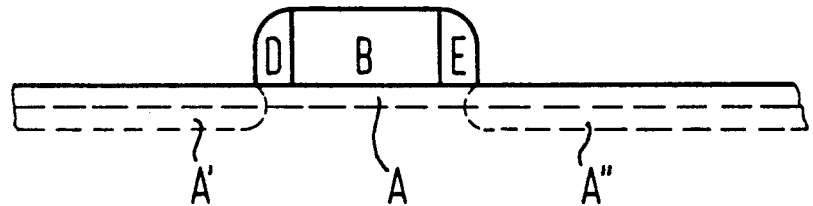
FIG. 2 illustrates the cross-sectional view of FIG. 1 having the high-temperature-resistant metal layer selectively etched to form two spacers adjacent to the auxiliary layer.

Referring now to FIG. 2, a cross-sectional view through the structure having the implanted source and drain region is illustrated.

In a preferred embodiment of the method of the present invention, the auxiliary layer B is selectively etched from the substrate after the source and drain regions are established by means of an ion implantation. The auxiliary layer B, for example, can be, aluminum, and the etching medium can be HCL. As needed, doping can be activated in this step of the method via a temperature step (typically 800° C./20 minutes). Subsequent selective etching of the second spacer E is made possible by covering the first spacer D within an adjustable resist mask F.

Figure 3:
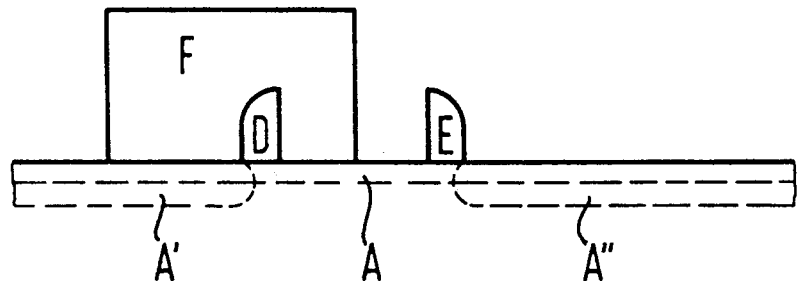
FIG. 3 illustrates the cross-sectional view of FIG. 2 having the auxiliary layer removed, and further having a resist mask selectively applied to one of the spacers.
Figure 4:
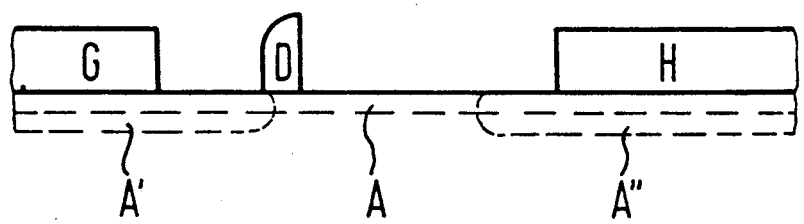
FIG. 4 illustrates the cross-sectional view of FIG. 3 having one of the spacers selectively removed, and further having a source metallization and a drain metallization.

FIG. 3 illustrates the resulting structure before selectively etching the second spacer E. A reactive ion etching (RIE) process using, for example, $SF_6$ gas mixtures is suitable for this purpose. After selectively etching the second spacer E, the first spacer D forms the actual gate metallization. Activating the doping in to form the source and drain regions via a temperature step is preferably performed after etching away the second spacer E. FIG. 4 illustrates the resultant structure after removing the resist mask F, and after depositing and alloying the metallization for the source region G and for the drain region H the metallizations being composed of a metal suitable for ohmic contact. A lift-off technique can be used to produce this structure.

Figure 5:
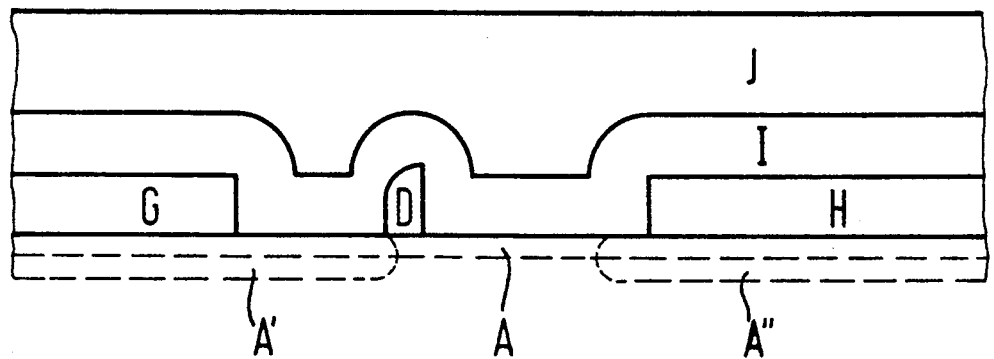
FIG. 5 illustrates the cross-sectional view of FIG. 4 having a surface-wide dielectric layer, leveled by a resist layer, applied to the surface.
Figure 6:
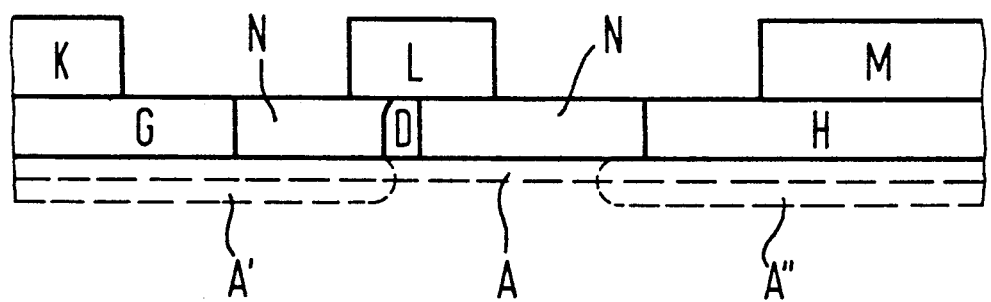
FIG. 6 illustrates the cross-sectional view of FIG. 5 having the dielectric layer planarized by an etching process, where the remaining portions of the dielectric serve as a passivation layer, and connecting metallizations are applied to the resulting planar surface.

As illustrated in FIG. 5, a dielectric layer I, for example $Si_3N_4$, is deposited across the surface, conforming to the edges for the gate D, drain metallization H, and source metallization G. A resist layer J can be applied above the dielectric layer I, as shown in FIG. 5. The structure of FIG. 5 can be etched with a suitable RIE process, such that the dielectric layer I is removed from the surfaces of the source metallization G, the first spacer D, and the drain metallization H, and the dielectric layer I remains between the metallizations as a passivation layer N, see FIG. 6. The connecting metallizations are applied onto the structure, etched with a suitable RIE process, and respectively applied above the contact metallizations, thus providing the source metallization G with a connecting metallization K, and the first spacer D with a second connecting metallization L. The second connecting metallization L is insulated from the remaining metallization by the passivation layer N, and the drain metallization H is provided with a third connecting metallization M by a lift-off technique. The second connecting metallization L also functions to reinforce the gate metallization, resulting in a large gate cross section.

Figure 7:
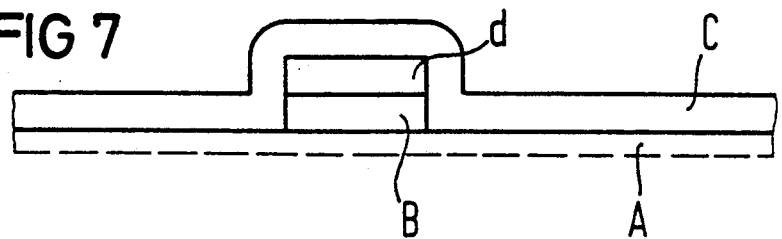
FIG. 7 illustrates a cross-sectional view of a second embodiment of a semiconducting substrate having a dielectric auxiliary layer, a metal strip placed thereon, and a surface-wide high-temperature-resistant metal in accordance with the principles of the present invention.

In an embodiment as illustrated in FIG. 7, the auxiliary layer B can be a dielectric, that remains on the conductive layer A until its removal at a later step, or it can remain as a portion of the passivation layer N. It is possible to enlarge the gate cross section by using a dielectric auxiliary layer B that remains as a passivation layer, and depositing an additional metal layer d, having electrical contact with the first spacer D, on the dielectric auxiliary layer B. A metal layer C is then deposited across the surface. The metal layer C is chosen so that it can be selectively etched with respect to the metal strip d. For example, the metal strip d can be tungsten.

Figure 8:
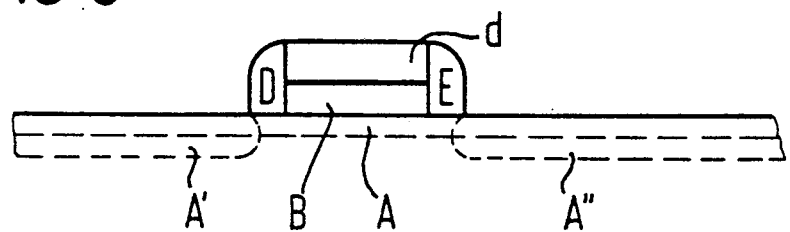
FIG. 8 illustrates a cross-sectional view of FIG. 7 having the high-temperature-resistant layer selectively etched to from two spacers adjacent to both the dielectric auxiliary layer and the metal strip placed thereon.

FIG. 8 illustrates the spacers D and E that result from the etching away of the metal layer C. The metal strip d remains after the etching process.

Figure 9:
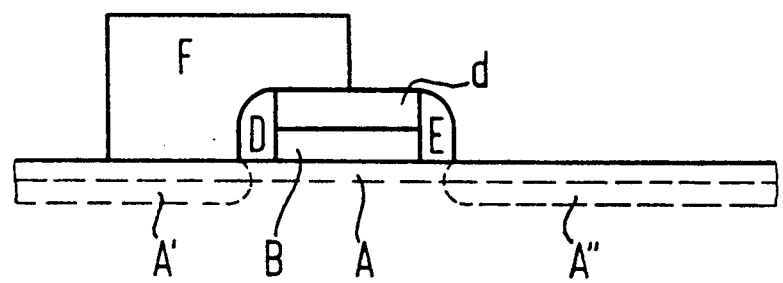
FIG. 9 illustrates a cross-sectional view of FIG. 8 having a resist mask selectively applied to one of the spacers.

In the method step illustrated in FIG. 9, the first spacer D is covered with a resist mask F allowing the second spacer E to be selectively etched away. Due to the selection of the various metals of the metal layer C and metal strip d, the second spacer E can be selectively etched off so that the metal strip d remains.

Figure 10:
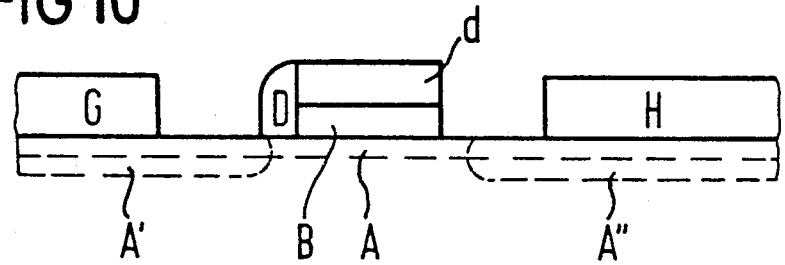
FIG. 10 illustrates a cross-sectional view of FIG. 9 having one of the spacers selectively removed, and further having a source metallization and a drain metallization.

To create the structure illustrated in FIG. 10, the resist mask of FIG. 9 is removed. In FIG. 10, the first spacer D forms a metal-to-semiconductor contact, thereby binding the metal strip d. The gate metallization is thus composed of the first spacer D and of the metal strip d. In comparison to the above-described method, a structure having a larger cross-sectional gate metallization results. The short gate lengths that are achieved by the present invention are preserved because, the metal strip d is insulated from the semiconductor material, and the dielectric auxiliary layer B serves as a passivation layer. The auxiliary layer B can be composed of, for example, $Si_3N_4$.

Figure 11:
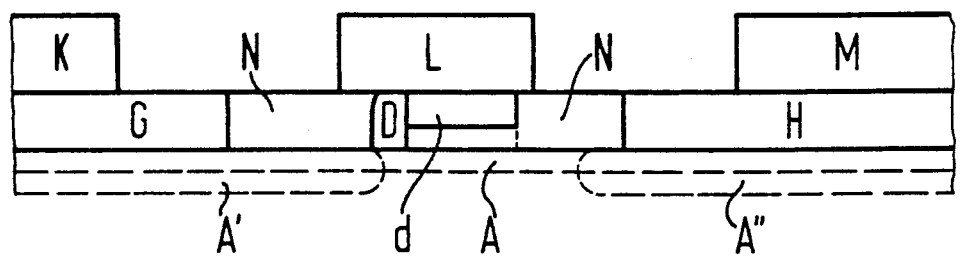
FIG. 11 illustrates a cross-sectional view of FIG. 10 having the interspaces between the source, gate and drain metallizations filled with a passivation layer, planarized by a etching precess, and further having connecting metallizations applied to the source, gate, and drain regions.

Referring now to FIG. 11, the interspace defined by the source metallization G, the gate metallization D and d and the drain metallization H can be filled with a passivation layer N, such that the surface is planarized. Subsequently, connecting metallizations K, L, and M are applied. Alternatively, the passivation layer N can be applied prior to the application of the source metallization G and the drain metallization H. The source and drain metallizations, G and H respectively, can be subsequently applied via holes etched through the passivation layer N. This modification of the manufacturing method has the advantage that the surface does not require planarization following the application of the passivation layer N.

Figure 12:
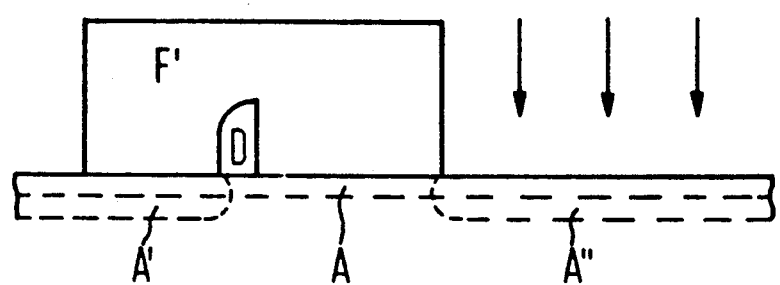
FIG. 12 illustrates a cross-sectional view of FIG. 3 wherein an LDD implantation is effected following etching off of a spacer.
Figure 13:
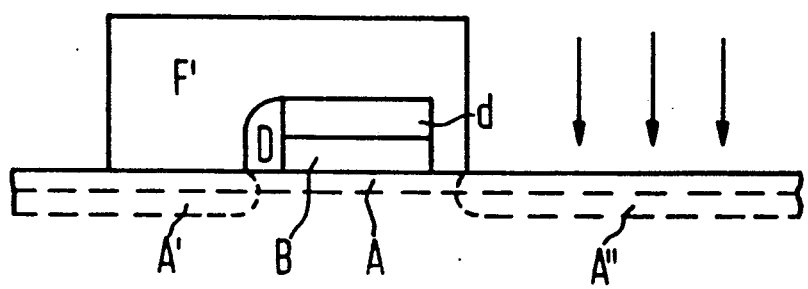
FIG. 13 illustrates a cross-sectional view of FIG. 9 wherein an LDD implantation is effected following etching off of a spacer.

In a further embodiment, the dielectric layer I can be applied after the second spacer E is etched off, and can serve as a cover layer in the ion doping. The source metallization G and the drain metallization H must then be deposited via holes etched into the dielectric layer I. In a further modification of the method, an LDD implantation may be implemented after the second spacer E is etched off, such that the drain region A" is of a somewhat lower-impedance compared to the channel proceeding between the source and the drain regions, without altering, to a significant degree, the breakdown voltage, as is shown in FIG. 12 and FIG. 13, respectively.

The advantages of the manufacturing method of the invention include that it provides a method wherein the self-aligned source and drain regions, can be arranged asymmetrically relative to the gate. This results in, a low source resistance, high transconductance, high breakdown voltage, and minimal short-channel effects. Further, short gate lengths in the 100 nm range can be realized with optical lithography through the method of the invention. Such gate lengths are predominantly manufactured by lacquer structures printed with an electron beam, given the tradititional manufacturing methods of such components. When writing with an electron beam, the adjustment of the actual writing event is extremely time-consuming. Therefore, the manufacture of FET's with short gate lengths is preferred. Also, a low-impedance gate is obtained with the method of the invention as a result of the gate reinforcement, metallization L, allowing for a large gate cross section. Further, the gate is ageing-resistant, as well as temperature-resistant.

We claim:

1. A method for manufacturing a field effect transistor having a source and a drain region arranged asymmetrically with respect to a gate region, comprising the steps of:
   A) applying a strip-shaped auxiliary layer to a conductive layer on a surface of a semiconducting substrate, said strip-shaped auxiliary layer being symmetrically disposed relative to a first region and a second region of said semiconducting substrate;
   B) depositing a high-temperature-resistant metal, to function as a gate metallization, across said surface of said semiconducting substrate;
   C) etching said high-temperature-resistant metal from said first region and said second region, such that a first spacer and a second spacer remain to the sides of said auxiliary layer;
   D) doping said first region and said second region, said auxiliary layer combined with said first spacer and said second spacer serving as a masking layer for selectively doping said first region and said second region, the doping of said first region yielding a source region, and the doping of said second region yielding a drain region;
   E) covering said first spacer with a resist mask, selectively etching away said second spacer;
   F) applying a source metallization to said source region; and
   G) applying a drain metallization to said drain region.

2. The method of claim 1 including the step of applying a first passivation layer of a dielectric to the interspace between said source metallization and said first spacer and applying a second passivation layer of a dielectric to the interspace between said drain metallization and said first spacer, wherein said first spacer forms a gate metallization.

3. The method of claim 1 including the steps of depositing a dielectric layer across said surface, further depositing a resist layer having a planar surface across said dielectric layer, etching a portion of said source metallization, said gate metallization and said drain metallization such that said etched portion is exposed, and said dielectric layer remaining between said source metallization, said gate metallization, and said drain metallization, thereby forming a passivation layer, such that an essentially planar surface is formed by a free surface of said source metallization, said gate metallization, said drain metallization, and said passivation layer in combination.

4. The method of claim 1 wherein steps (F) and (G) include the additional steps of depositing a dielectric layer across the surface, etching a plurality of holes in said dielectric layer for a source and a drain region, and further depositing said source metallization and drain metallization via said plurality of holes, wherein the surface of said gate metallization is at least partially exposed.

5. The method of claim 1 including a temperature step for annealing the doping prior to etching the second spacer of the step (E).

6. The method of claim 1 including a temperature step for annealing of doping subsequent to etching the second spacer of the step (E).

7. The method of claim 5 wherein the temperature step consists of heating said metal at 800° C. for twenty minutes.

8. The method of claim 6 wherein the temperature step consists of heating said metal at 800° C. for twenty minutes.

9. The method of claim 6 including the step of implanting a lightly doped drain into the drain region subsequent to the etching of the second spacer, of step (E), and prior to performing said temperature step.

10. The method of claim 1 including the step of removing said auxiliary layer subsequent to the execution of the step (D).

11. The method of claim 1 including the step of applying a dielectric auxiliary layer to said semiconducting substrate, wherein said dielectric auxiliary layer can be used as a passivation layer.

12. The method of claim 11 including the steps of applying a metal strip, said metal strip proceeding with conforming edges relative to said auxiliary layer, onto said auxiliary layer of step (A), selecting said metal of said metal layer such that said metal of step (B) can be selectively etched with respect to said metal strip, arranging said metal strip such that at least said first spacer is in electrical contact therewith in step (C).

* * * * *